United States Patent
Wang et al.

[11] Patent Number: 6,143,140
[45] Date of Patent: Nov. 7, 2000

[54] METHOD AND APPARATUS TO IMPROVE THE SIDE WALL AND BOTTOM COVERAGE IN IMP PROCESS BY USING MAGNETIC FIELD

[75] Inventors: Wei Wang, Cupertino; Keith Miller, Santa Clara; James Van Gogh; Praburam Gopalraja, both of Sunnyvale, all of Calif.

[73] Assignee: Applied Materials, Inc., Santa Clara, Calif.

[21] Appl. No.: 09/375,253

[22] Filed: Aug. 16, 1999

[51] Int. Cl.[7] .................................................. C23C 14/35
[52] U.S. Cl. ............................ 204/192.12; 204/298.06; 204/298.16; 204/298.19; 204/198.15; 204/298.2
[58] Field of Search ..................... 204/298.16, 298.15, 204/298.2, 298.19, 298.06, 298.21, 298.22, 192.12

[56] References Cited

U.S. PATENT DOCUMENTS

| | | |
|---|---|---|
| 4,581,118 | 4/1986 | Class et al. ........................ 204/298.15 |
| 5,431,799 | 7/1995 | Mosely et al. ...................... 204/298.06 |
| 5,444,207 | 8/1995 | Sekine et al. ....................... 204/298.16 |
| 5,858,180 | 1/1999 | Hsu .................................... 204/298.16 |
| 5,876,574 | 3/1999 | Hofmann et al. .................. 204/298.19 |
| 5,902,461 | 5/1999 | Xu et al. ............................. 204/192.12 |
| 5,902,466 | 5/1999 | Gerrish et al. ..................... 204/298.16 |
| 5,922,182 | 7/1999 | Maass et al. ....................... 204/298.16 |

*Primary Examiner*—Nam Nguyen
*Assistant Examiner*—Daborah Chacko-Davis
*Attorney, Agent, or Firm*—Thomason, Moser & Patterson

[57] ABSTRACT

The present invention provides a method and apparatus for achieving conformal step coverage in a deposition process. In at least one aspect, a target provides a source of material to be sputtered by a plasma and then ionized by an inductive coil. At least a portion of the electrons provided by the plasma and ionized target material are deflected by a magnetic field established adjacent to the substrate. Under the influence of the attracted electrons, positively charged particles are induced to move in the direction of the electrons. The magnetic field may be provided by one or more magnets located internally or externally to the processing chamber and which can be rotated to ensure uniform deposition of the electrons and ions on the device features.

28 Claims, 5 Drawing Sheets

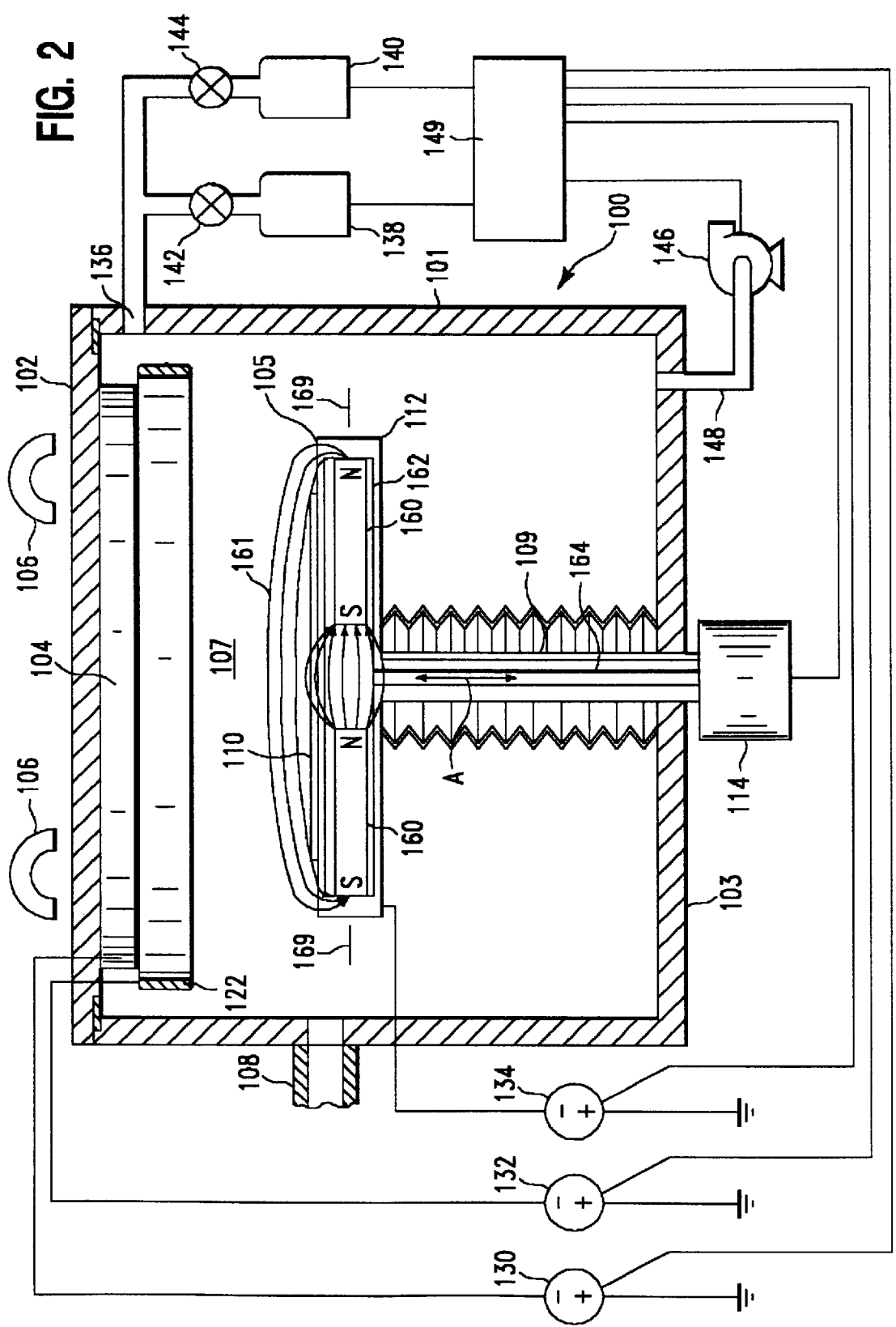

METHOD AND APPARATUS TO IMPROVE THE SIDE WALL AND BOTTOM COVERAGE IN IMP PROCESS BY USING MAGNETIC FIELD

BACKGROUND OF THE INVENTION

1. Field of the Invention

The present invention relates to an apparatus and method for processing substrates. Specifically, the invention relates to a method for depositing a conformal layer of material on a substrate in an ionized metal plasma process.

2. Background of the Related Art

Sub-quarter micron multi-level metallization represents one of the key technologies for the next generation of ultra large-scale integration (ULSI) for integrated circuits (IC). In the fabrication of semiconductors and other electronic devices, directionality of particles being deposited is important in filling features. As circuit densities increase, the widths of vias, contacts and other features have decreased to 0.25 μm or less, whereas the thicknesses of the dielectric layers remain substantially constant. Thus, the aspect ratios for the features, i.e., the ratio of the depth to the minimum lateral dimension, increases, thereby pushing the aspect ratios of the contacts and vias to 5:1 and above. As the dimensions of the features decrease, it becomes even more important to get directionality of the particles in order to achieve conformal coverage of the feature side walls and bottom.

One process capable of providing directionality to particles is ionized metal plasma-physical vapor deposition (IMP-PVD), also known as high density physical vapor deposition. A typical IMP-PVD chamber includes a coil for maintaining a high density, inductively-coupled plasma between a target and a susceptor on which a substrate is placed for processing. The plasma is generated by introducing a gas, such as helium or argon, into the chamber and then coupling energy into the chamber to ionize the gas. A magnetron assembly disposed behind the target provides magnetic field lines which trap electrons adjacent the target to cause increased ionization of the sputtering gas at the target surface. The constituents of the plasma are accelerated toward the target by a bias applied to the target causing the sputtering of material from the target by simple momentum transfer. Power supplied to the coil produces an electromagnetic field which induces currents in the plasma to intensify the density of the plasma and ionize the sputtered metal flux that traverses the electromagnetic fields generated by the coil. An electric field due to an applied or self-bias, develops in a boundary layer, or sheath, between the plasma and the substrate that accelerates the metal ions towards the substrate in a vector parallel to the electric field and perpendicular to the substrate surface. While the self-bias can be maintained by floating the susceptor relative to the plasma, the bias energy is preferably modulated by the application of power, such as RF or DC power, to the susceptor, thereby increasing the attraction of the sputtered target ions to the surface of the substrate in a highly directionalized manner to fill features in the substrate.

One of the problems encountered in IMP-PVD is an inability to achieve conformal coverage in the increasingly smaller device features. The directionality provided by the substrate bias results in good bottom coverage, but moderate side wall coverage. This result is caused in part by the induced directionality of ions toward the bottom of the features with little directionality toward the side walls. FIG. 1 illustrates the direction of ions 12 from a plasma 14 entering a via 16 formed on a substrate 10. The direction of the ions 12 is influenced by the electrical field E toward the bottom 18 of the via 16 resulting in little deposition on the side walls 20.

The limitations of IMP-PVD can result in non-conformal layers on device features. Conformal coverage of the bottom 18 and side walls 20 of the features is needed to optimize subsequent processes such as electroplating. For example, electroplating requires conformal barrier layers and conformal seed layers within the device features in order to ensure uniform filling of the feature. Thus, where the material is not conformably provided to the device features, subsequent processes, such as electroplating, may not be successful and result in the formation of defective devices.

Therefore, there is a need to provide a technique for providing better conformal coverage of device features, and in particular, better conformal coverage of side walls.

SUMMARY OF THE INVENTION

The present invention generally provides an apparatus and method for depositing a conformal layer on device features formed on a substrate in a plasma chamber using sputtered ionized material. In one embodiment, a chamber having a target, a substrate support member and a magnetic field generator to ionize the target material is provided. The target comprises the material to be sputtered by a plasma formed adjacent to the target during processing. A magnetic field generator provides a first magnetic field to ionize the sputtered material. The magnetic field generator may be one or more single-turn or multi-turn coils disposed in or near the processing region of the chamber. One or more magnets disposed in a region interior or exterior to the chamber provide a second magnetic field substantially parallel to an upper surface of the substrate support member during processing. The second magnetic field can be generated by permanent magnets or electromagnets or a combination thereof. Preferably, the second magnetic field is disposed to deflect charged particles having a velocity vector component oriented substantially perpendicular to the second magnetic field and to the upper surface of the substrate support member.

In another aspect of the present invention, a method for depositing material onto a substrate is provided. A plasma is provided to sputter a material from a target disposed in a vacuum chamber. The sputtered material is then ionized by a first magnetic field. A second magnetic field is provided parallel to an upper surface of a substrate to affect the direction of a portion of the electrons supplied by the plasma. In one embodiment, the second magnetic field is rotated about a central axis perpendicular to the substrate to cause uniform distribution of electrons onto surfaces of the substrate. In another embodiment, the second magnetic fields may be comprise at least two pair of magnetic field lines. The polarity of the second magnetic field may then be periodically alternated. Additionally or alternatively, the second magnetic field may be pulsed at a desired frequency or otherwise modulated in intensity.

In still another aspect of the invention, a method for depositing material onto a substrate having features formed thereon is provided. A material is sputtered from a target disposed in a vacuum chamber and ionized by a first magnetic field to produce at least ions and electrons. A second magnetic field oriented substantially parallel to the upper surface of the substrate deflects a portion of the electrons having a velocity vector component perpendicular to the second magnetic field. Thus, a portion of the electrons are deflected toward the side walls of the features formed in the substrate. Ions are then entrained by the deflected electrons and are propelled toward the side walls under the attractive influence of the deflected electrons. The second magnetic field can rotated about a central axis perpendicular to the substrate to cause uniform distribution of the electrons onto the features of the substrate, and in particular onto the side walls.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

FIG. 2 is a cross section of a simplified typical processing chamber using a coil.

DETAILED DESCRIPTION OF THE PREFERRED EMBODIMENT

Figure 1:
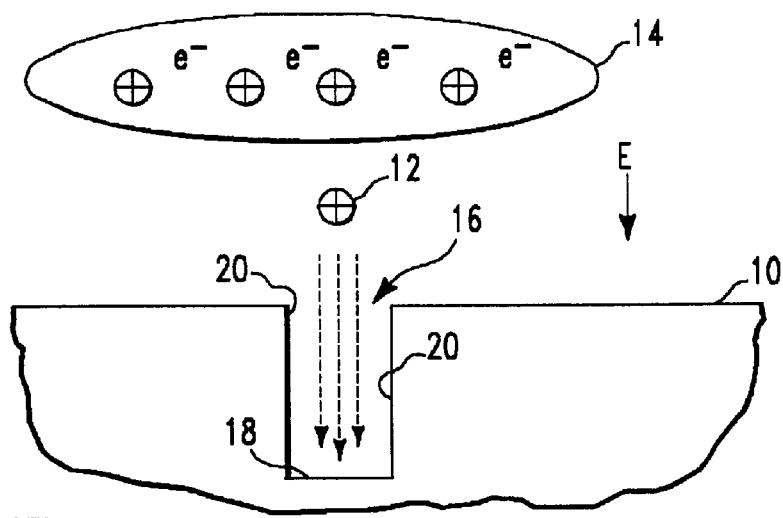
FIG. 1 is a cross section of a substrate having a via formed therein.

The embodiments described below preferably use a modified ionized metal plasma (IMP) process that can be carried out using process equipment, such as an Endura® platform and ion metal plasma chamber, available from Applied Materials, Inc., located in Santa Clara, Calif. with modifications as described below. One ion metal plasma (IMP) processing chamber, known as an IMP VECTRA™ chamber, is available from Applied Materials, Inc., of Santa Clara, Calif.

FIG. 2 is a schematic cross-sectional view of an IMP chamber 100 according to the present invention. The chamber 100 includes walls 101, lid 102, and bottom 103. A target 104 comprising the material to be sputtered is mounted to the lid 102 and disposed in the chamber 100 to define an upper boundary of a processing region 107. Magnets 106 disposed behind the lid 102, which may be part of a rotatable magnetron, form magnetic field lines at the target surface which trap electrons and increase the density of a plasma adjacent to the target 104 in order to increase the sputtering efficiency. A substrate support member 112 supports the substrate 110 and defines the lower boundary of the processing region 107. The substrate support member 112 is movably disposed in the chamber 100 and provides an upper support surface 105 for supporting a substrate 110. The support member 112 is mounted on a stem 109 connected to a motor assembly 114 that raises and lowers the substrate support 112 between a lowered loading/unloading position and a raised processing position. An opening 108 in the chamber 100 provides access for a robot (not shown) to deliver and retrieve substrates 110 to and from the chamber 100 while the substrate support member 112 is in the lowered loading/unloading position. A coil 122 is mounted in the chamber 100 between the substrate support member 112 and the target 104 and provides electromagnetic fields in the chamber 100 during processing to assist in generating and maintaining a plasma between the target 104 and substrate 110.

One or more gases, including a plasma gas, are supplied to the chamber 100 through a gas inlet 136 from gas sources 138, 140 as metered by respective mass flow controllers 142, 144. One or more vacuum pumps 146 are connected to the chamber 100 at an exhaust port 148 to exhaust the chamber 100 and maintain the desired pressure in the chamber 100. Preferably the vacuum pumps 146 include a cryopump and a roughing pump and are capable of sustaining a base pressure of about $10^{-8}$ mTorr.

Three power supplies are used in the chamber 100. A first power supply 130 delivers either RF or DC power to the target 104 to cause the one or more plasma gases to form a plasma. A second power source 132, preferably an RF power source, supplies electrical power in the megahertz range to the coil 122 to increase the density of the plasma. A third power source 134, preferably an RF or DC power source, biases the substrate support member 112 with respect to the plasma and provides attraction of the ionized sputtered material toward the substrate 110. As will be explained below, the third power source is optional and its use depends on the particular embodiment of the invention.

Figure 3:
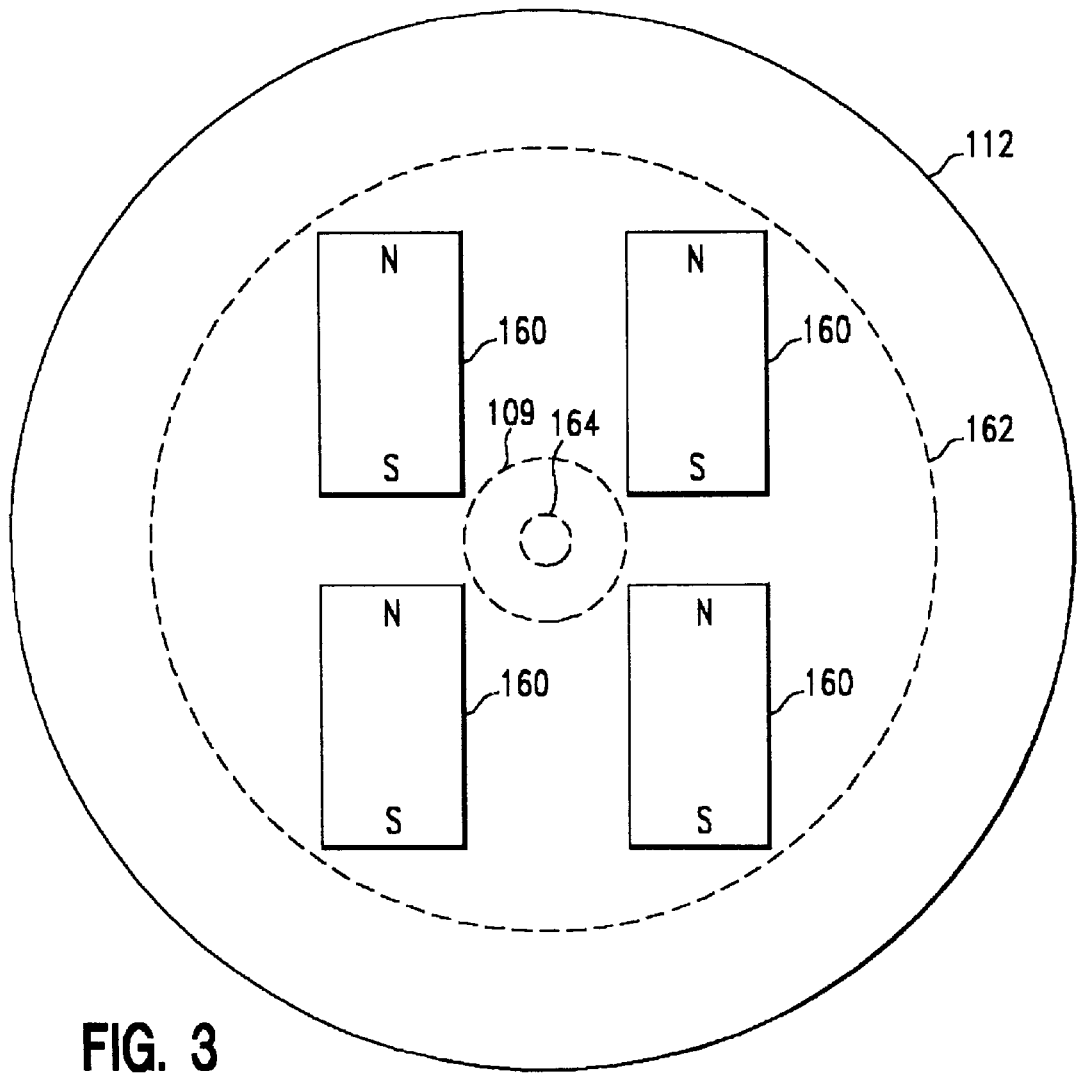
FIG. 3 is a top view of a substrate support member having a magnetron disposed therein.

The chamber 100 of the invention preferably provides a magnetic field 161, at least a portion of which is parallel to the upper surface of the substrate 110. Further, the magnetic field 161 and the substrate 110 are preferably rotatable relative to one another. FIG. 2 shows one embodiment of the invention wherein magnets 160 are disposed in the substrate support member 112 parallel to a plane 169. The magnets 160 are preferably components of a magnetron 162 capable of rotating about a central axis A. A shaft 164 disposed through the stem 109 is coupled at an upper end to the magnetron 162 and at a lower end to the motor assembly 114 which actuates the shaft 164 in a rotational direction about the axis A. Preferably, the magnetron 162 includes four magnets 160 having their polarities disposed along a common direction. For example, FIG. 3 shows a top view of the support member 112 and the magnetron 162 wherein the magnets 160 are oriented such that the respective north poles are pointing in a first direction and the respective south poles are oriented in a second opposite direction relative to the first direction. The precise orientation of the magnets 160 is not limiting of the invention so long as a substantial horizontal component of the magnetic field 161 is produced throughout the substrate 110. By horizontal is meant that a portion of the magnetic field 161 is parallel to the upper surface of the substrate 110. In addition to the direction of the magnetic field 161 its uniformity must be sufficient to achieve conformal and uniform deposition of a material sputtered from the target 104 as will be explained in greater detail below. The magnetic field 161 shown in FIG. 2 is merely illustrative and is understood that the resulting magnetic field lines uniformly occupy the region in which the substrate 110 is positioned and preferably have a horizontal component over the full diameter of the substrate 110.

While FIG. 3 shows four magnets, other embodiments may include more or less. Thus, the invention contemplates an embodiment using only a single magnet having its poles rotated about the axis A. However, preferably more than one magnet is used to generate the magnetic field 161 because of the resulting uniformity of field lines at the upper surface of the substrate 110. Because the deposition uniformity during processing depends on the magnetic field lines 161, the magnetic field lines 161 are preferably uniform across the upper surface. In general, as substrate diameters are increased the number of magnets is also increased to ensure uniformity of the magnetic field 161 across the larger surface area of a larger substrate.

A controller 149 controls the functions of the power supplies, motor assemblies, mass flow controllers for gas injection, vacuum pump, magnetron and other associated chamber components and functions. The controller 149 executes computer readable code of a system control software product stored in a computer usable medium, which in the preferred embodiment is a hard disk drive, and can include analog and digital input/output boards, interface boards, and stepper motor controller boards. The computer readable code includes, for example, power control code for controlling the power sources 130, 132, 134 and gas control code for controlling the gas sources 138,140. Optical and/or magnetic sensors are generally used to move and determine the position of movable mechanical assemblies.

In operation, a robot delivers a substrate 110 to the chamber 100 through the opening 108. After depositing the substrate 110 unto the upper surface 105 of the support member 112 the robot retracts from the chamber 100 and the opening 108 is sealed. The substrate support member 112 then raises the substrate 110 into a processing position. Preferably, the space between the target 104 and the substrate support member 112 in a raised processing position is between about 40 mm and 190 mm and most preferably about 140 mm. One or more plasma gases are then introduced into the chamber 100 from the gas sources 138, 140 to stabilize the chamber 100 at a processing pressure. The magnets 106, which comprise components of a magnetron, then form a plasma adjacent the target 104 and the first power source 130 provides a bias which attracts the charged particles of the plasma toward the target 104 to cause sputtering therefrom.

The magnetic fields produced by the coil 122 induce currents in the plasma to densify the plasma. The resulting high-density plasma ionizes the sputtered target material flux passing through the processing region. A portion of the ions formed from the sputtered target material traverse the space between the target 104 and the support member 112 and deposit on the substrate 110. Where the support member 112 is electrically floating relative to the plasma, a self-bias develops between the support member 112 and the plasma which attracts the positively charged ions toward the substrate 110. In a preferred embodiment, the third power source 134 is used to increase the negative bias to the support member 112, thereby increasing the directionality of the ions toward the substrate 110 and resulting in a substantially vertical descent of the ions parallel to axis A into the features of the substrate 110.

However, where the magnets 160 are permanent magnets disposed in the support member 112, as shown in FIGS. 2 and 3, an applied bias provided by the third power source 134 may cause demagnetization of the magnets 160. Thus, in an embodiment using permanent magnets the third power source 134 is preferably not used. While an embodiment without the third power source 134 provides less directionality than is possible with the third power source 134, the inventors have achieved good results even without the third power source 134.

The magnets 160 provide the magnetic field 161, a portion of which is substantially parallel to the upper surface of the substrate 110. Preferably, the magnetron 162 is rotated during the deposition cycle so that the magnetic field 161 is rotated about the axis A. The angular velocity of the magnetron 162 may be held constant or be pulsed at a desired frequency. By "pulsed" it is meant that the magnetron 162 is rotated a fraction of 360 degrees intermittently. For example, the magnetron 162 may be rotated 90 degrees every thirty seconds, thereby completing a full rotation every 120 seconds. The foregoing is merely illustrative and other pulsing cycles can also be used.

Following the deposition cycle, the substrate support member 112 is lowered to a loading/unloading position. The robot is then extended into the chamber 100 through the opening 108 and the substrate is placed on the robot for removal from the chamber 100 and delivery to a subsequent location. Subsequent locations include various processing chambers, such as electroplating chambers, where the substrate 110 undergoes additional processing.

The directionality of the ionized target material during processing is determined primarily by the initial emission profile at the surface of the target 104, the kinetic interaction of the ions with the plasma gases, the voltage drop across the processing region 107 and the magnetic field 161. Good step coverage on the device features of the substrate 110 is achieved by ensuring proper proportions of bottom coverage and side wall coverage of the features. The voltage drop across the boundary layer between the plasma and substrate 110, due to the applied or self-bias, effects an electrical field perpendicular to the substrate 110 which provides directionality of the ionized target material toward the substrate 110, thereby enhancing bottom coverage. In order to achieve improved side wall coverage, magnets 160 of the magnetron 162 provide a rotating magnetic field 161 parallel to the upper surface of the substrate 110 capable of deflecting a portion of the electrons toward the side walls. The deflected electrons then entrain a portion of the ionized target material, thereby resulting in deposition of ions on the side walls.

Figure 4:
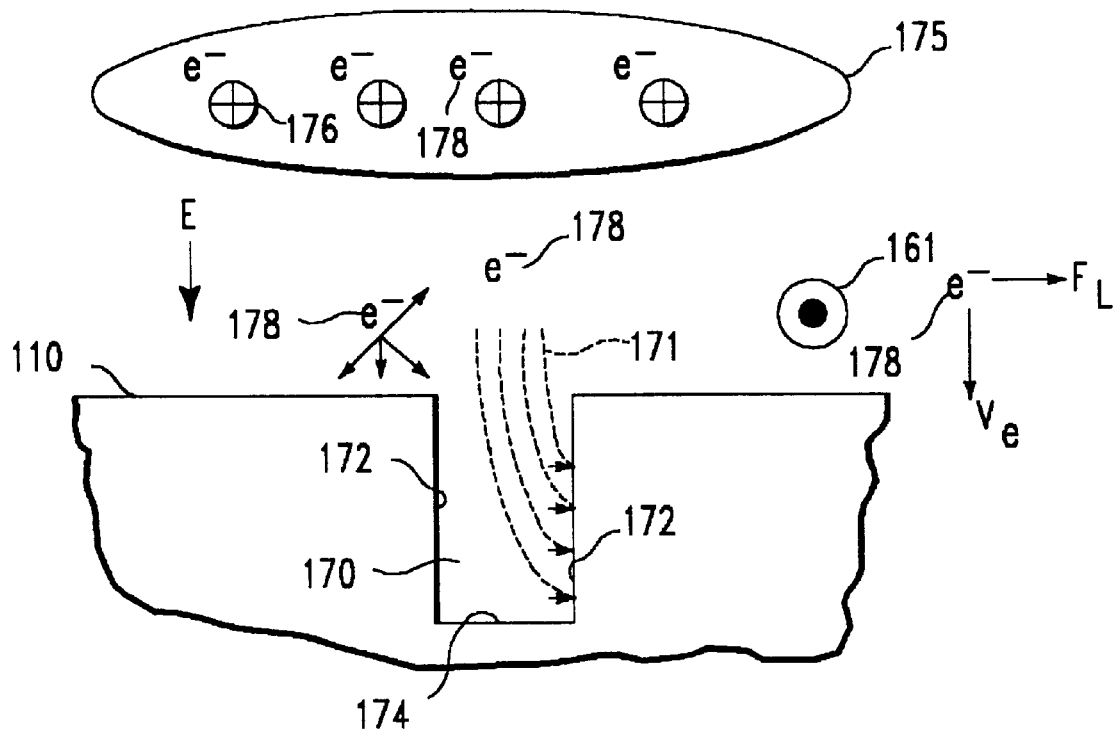
FIG. 4 is a cross section of a substrate via formed in a dielectric material showing the deflection of electrons by a magnetic field.
Figure 5:
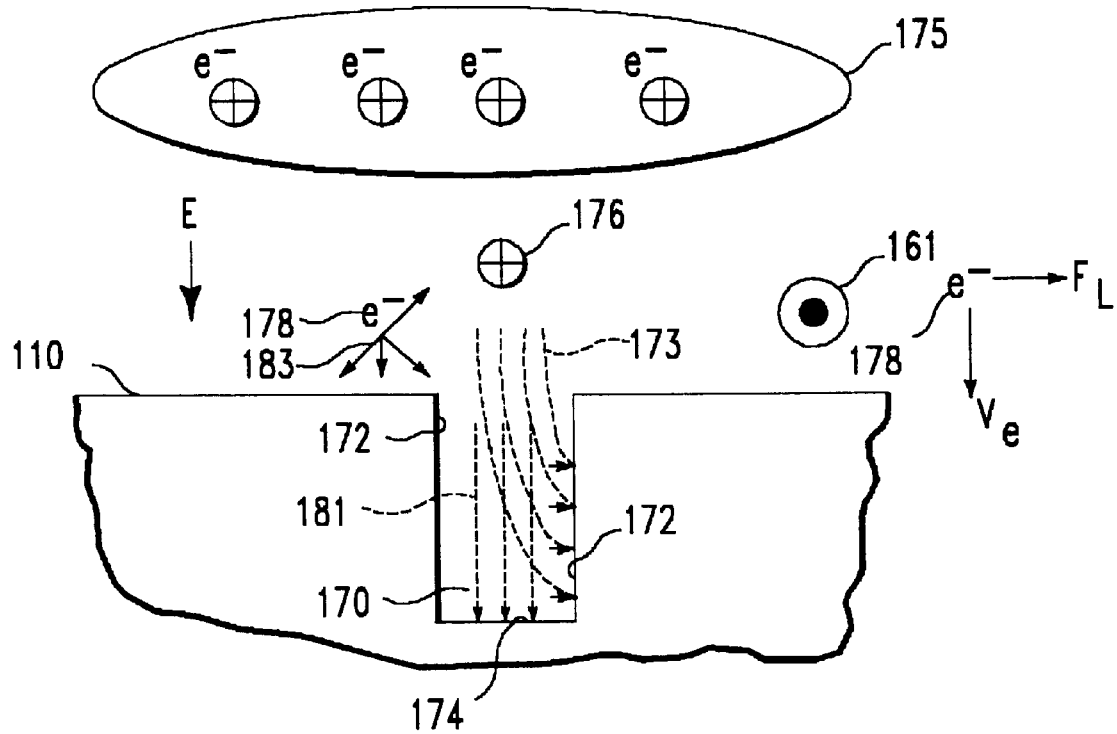
FIG. 5 is a cross section of a substrate via formed in a dielectric material showing the deposition of ions on side walls of the via of FIG. 5a under the attraction of electrons disposed on the side walls.

The theorized interrelated dynamics of the ions and electrons may be understood with reference to FIGS. 4–5 which show a cross section of the substrate 110 having a device feature 170 formed thereon. A via 170 is shown having side walls 172 and a bottom 174. The magnetic field 161 is shown oriented parallel to the upper surface of the substrate 110 and the side walls 172 and perpendicular to the plane of the page. A plasma 175 comprising ions 176 and electrons 178, formed primarily from the sputtered target material, is shown adjacent to the upper surface of the substrate 110. An electric field E normal to the substrate 110 produced by the applied or self-bias accelerates the ions 176 into the via 170. Without the magnetic field 161, a substantial portion of the ions 176 continue downward into the via 170 and strike the bottom 174 with little deposition on the side walls 172. It is believed that by applying the magnetic field 161 according to the present invention, electrons 178 having a velocity vector component ($v_e$) perpendicular to the magnetic field 161 are deflected by a Lorenz Force ($F_L$) perpendicular to both $v_e$ and the magnetic field 161 as shown in FIG. 4. The electron distribution 183 indicates a net velocity bias in the direction of $F_L$ due to the magnetic field 161. As a result, the electrons 178 are deflected toward the side walls 172 by the magnetic field 161 as shown by arrows 171 in FIG. 4. The inventors postulate that because of the significantly higher mass-to-charge ratio of the ions 176 relative to the electrons 178, the ions 176 are substantially unaffected by the magnetic field 161, which is preferably at least about 200 Gauss. However, nearby ions 176 are entrained by the deflected electrons and propelled toward the side walls 172 under the attractive coulomb force of the electrons 178 as shown by arrows 173 in FIG. 5.

Thus, the influence of the deflected electrons is to increase the horizontal velocity component (i.e., the component parallel to the upper surface of the substrate 110) of the target material ions 176, thereby resulting in conformal deposition on the side walls 172. Further, a portion of the ions 176 having sufficient kinetic energy traverse the height of the via 170 under the influence of the electric field E and are deposited on the bottom 174 as shown by arrows 181. As a result, the bottom 174 and the side walls 172 of the via 170 are conformally covered. The kinetic energy (eV) needed for the ions 176 to reach the bottom 174 depends on the processing parameters which will be readily adjusted for the desired results by those skilled in the art.

Although the strength of the magnetic field 161 may be adjusted to achieve the desired degree of electron deflection, the inventors have found that a 50–800 Gauss magnetic field is sufficient to produce good side wall coverage for aspect ratios of about 3.5:1 and higher. Most preferably, the magnetic field 161 is at least about 200 Gauss. Although in theory the present invention can be adapted to manipulate the direction of the ions directly, without regard for the electrons, the magnetic field strength required to deflect the ions is on the order of 1000 times greater than is necessary to deflect an electron.

The invention is not limited by a particular structural arrangement and may be constructed in any fashion so long as magnetic field lines 161 are generated substantially parallel to the upper surface of the substrate 110. Thus, FIGS. 2 and 3 are merely illustrative and persons skilled in the art will recognize a variety of techniques and configurations which fall within the scope of the invention. For example, the magnets 160 could include an assembly of magnets disposed externally to the chamber 100, such as adjacent to the walls 101. Further the magnets 160 may be permanent magnets, electromagnets or any combination thereof.

Figure 6:
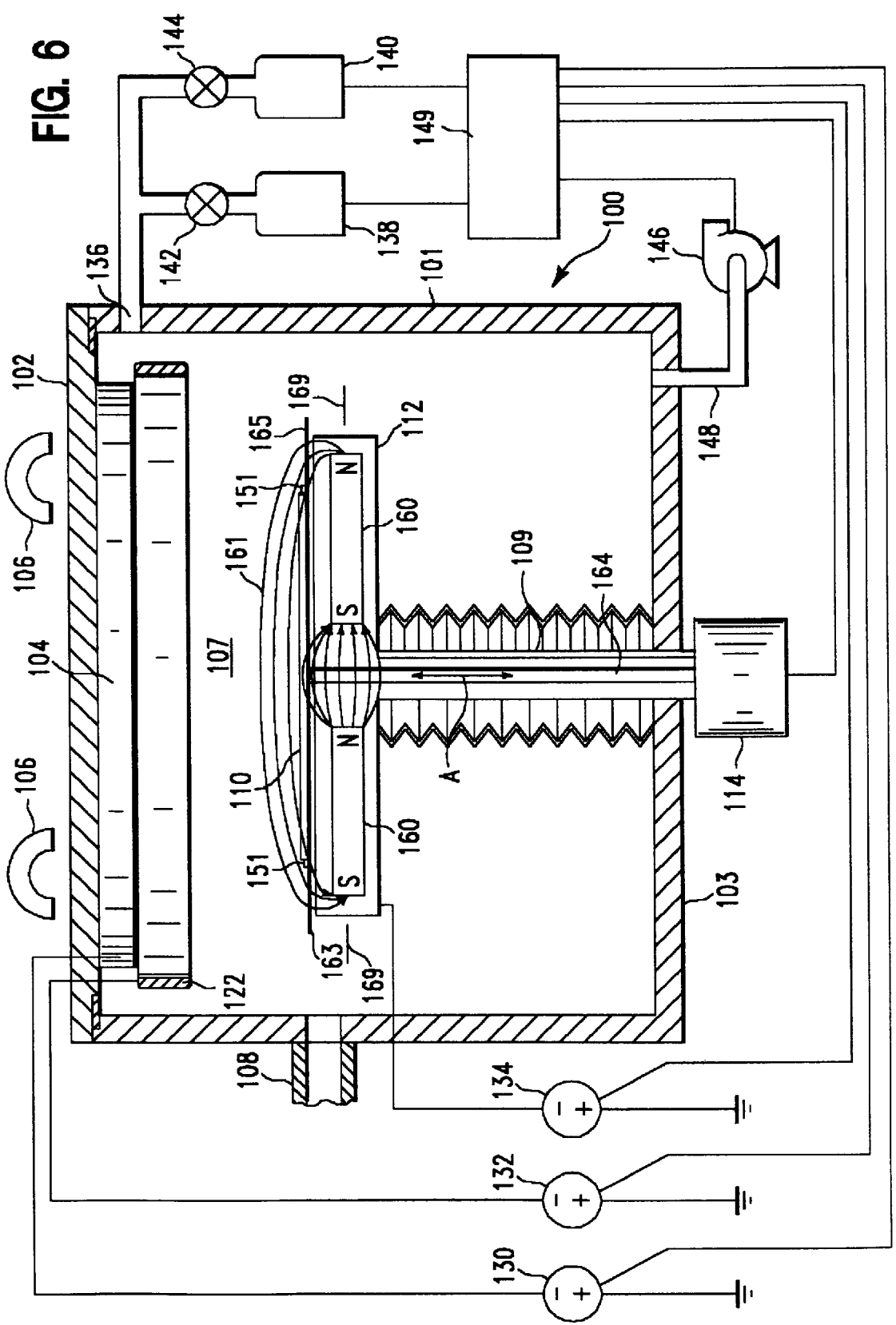
FIG. 6 is a simplified cross section of another embodiment of a processing chamber using a coil.

Additionally, while the substrate 110 and the magnetic field 161 are preferably rotated relative to one another by rotating the magnets 160, in another embodiment the substrate 110 may be rotated while the magnets 160 are kept stationary. One such embodiment is shown in FIG. 6. Where appropriate, the numerals have been carried over from FIG. 2 to identify chamber components which are the same as those described above. Generally, the embodiment shown in FIG. 6 is similar in all respects to the embodiment shown in FIG. 2 except in the manner in which the relative movement of the substrate 110 and the magnetic field 161 is provided. Thus, FIG. 6 shows the substrate 110 disposed on a rotatable plate 163 having sufficient dimensions to accommodate the substrate 110. The plate 163 includes a mounting surface 165 preferably having an annular lip 151 of a diameter sized to accommodate the substrate 110. The lip 151 stabilizes the substrate 110 during rotation of the plate 163 in operation. In one embodiment, the mounting surface 165 is made of a non-magnetic material such as aluminum. A shaft 164 extending through the stem 109 is coupled to the plate 163 at one end and the motor assembly 114 at another. The motor assembly 114 is adapted to impart rotation to the shaft 164 and plate 163. The plate 163 is in close proximity with the support member 112 which houses the magnets 160. The magnets 160 are disposed such that the respective magnetic poles lie along a plane 169 substantially parallel to the upper surface of the substrate 110, thereby producing a magnetic field 161 a portion of which is also substantially parallel to the upper surface of the substrate 110. In contrast to the embodiment of FIG. 2, the magnets 160 are fixedly disposed relative to the support member 112. In operation, the motor assembly 114 is energized to cause rotation of the plate 163 and substrate 110 relative to the magnets 160 and related magnetic field 161 about the axis A. As a result, the magnetic field 161 sweeps through the processing region and the substrate 110 to provide a force to the electrons moving toward the substrate 110, as described above with reference to FIG. 2.

Figure 7:
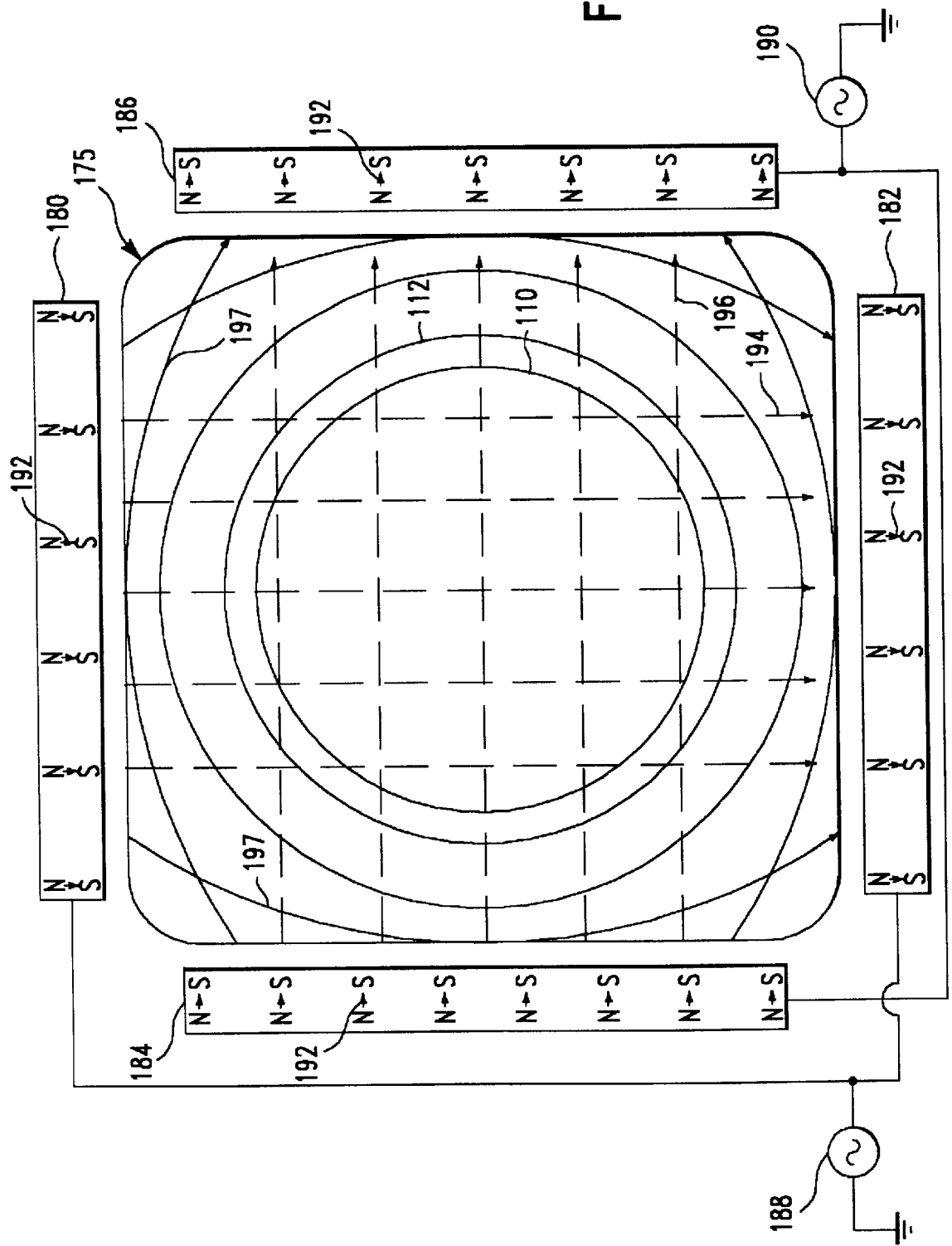
FIG. 7 is a top view of a chamber having a coil disposed therein and showing electromagnets disposed in a region external to the chamber.

Another embodiment of the invention using electromagnets is shown in FIG. 7. FIG. 7 is a top view of a chamber 175 showing the substrate support member 112 having the substrate 110 disposed thereon. Except where indicated otherwise, chamber 175 is substantially similar to chamber 100 of FIG. 2 and like numerals relate to like components. Elongated electromagnets 180, 182, 184, 186 are shown positioned around the chamber 175 in a square-like arrangement such that adjacent magnets are perpendicularly related and opposing magnets are parallel with respect to one another. Although the magnets 180, 182, 184, 186 are shown disposed in a region external to the chamber 175, in another embodiment, the magnets 180, 182, 184, 186 may be disposed within the enclosure of the chamber 175. Preferably, the magnets 180, 182, 184, 186 are equidistant from the substrate 110 and have a length at least equal to the diameter of the substrate 110. The electromagnets 180, 182, 184, 186 comprise a first pair 180, 182 and a second pair 184, 186 of opposing magnets wherein each pair is coupled to a power source 188, 190, respectively.

In operation, the magnetic fields produced by the magnets 180, 182 and 184, 186 are modulated to control the deposition results. In one embodiment, the power sources 188, 190 selectively provide power to the two pairs of magnets 180, 182 and 184, 186 to induce a plurality of magnetic dipoles 192 which establish two magnetic fields 194, 196 ninety (90) degrees out of phase with one another. Preferably, the polarity of the dipoles 192 is alternated by reversing the potential of the power sources such that the directions of the magnetic fields 194, 196 are fully reversible. Alternating the dipole polarity ensures greater uniformity of electron deposition on the side walls of the device features because the direction of electron deflection is determined by the direction of the magnetic fields 194, 196. In another embodiment, the electromagnets 180, 182, 184, 186 may be part of a magnetron which is rotated to cause uniform deposition of the electrons.

In addition, the magnetic fields 194, 196 may be pulsed to further control the ratio of deposition on the bottom to the side walls of the features. In one embodiment involving pulsed magnetic fields 194, 196, the deposition process can include three phases. In a first phase, the magnetic fields 194, 196 are oriented according to a first polarity and in a second phase the magnetic fields 194, 196 are oriented according to a second polarity. Thus, the first and second phases involve alternating the polarity of the magnetic fields 194, 196 as described above. In a third phase, the power sources 188, 190 are electrically disconnected from the two pairs of magnets 180, 182 and 184, 186 to eliminate the magnetic fields 194, 196. In one embodiment, the electrical discontinuity can be provided by use of a switch disposed in the electrical line coupling the power sources 188, 190 and the two pairs of magnets 180, 182 and 184, 186. Alternatively, the power sources 188, 190 can be pulsed power sources.

Thus, the first and second phases provide greater deposition on the side walls of the features due to the presence of the magnetic fields 194, 196, while the third phase provides relatively less deposition on the side walls, thereby decreasing the ratio of deposition on the side walls to the bottom of the features. As a result, the process provides conformal step coverage in the features and can be controlled by adjusting the frequency of the pulsing and duration of each of the three phases.

As noted above, the length of the electromagnets 180, 182, 184, 186 is preferably at least equal to the diameter of the substrate 110, thereby further ensuring the uniformity of the magnetic fields 194, 196 over the substrate by eliminating any fringe field lines 197 over the substrate 110. Fringe field lines 197 refer to perimeter portions of magnetic fields which exhibit curved field lines, as opposed to the substantially straight field lines 194, 196 shown in FIG. 7. Because the deposition of ions on the substrate 110 is directly related to the orientation of the magnetic fields 194, 196 relative to the substrate 110, the presence of fringe field lines 197 can result in non-uniform deposition. Thus, to ensure deposition uniformity, the magnetic fields 194, 196 are preferably uniform over the surface of the substrate being processed by providing electromagnets 180, 182, 184, 186 of sufficient length.

EXAMPLES

Tables I and II below provide the process parameters for deposition processes according to a conventional IMP-PVD method and according to the present invention, respectively.

TABLE I

| Parameter | |
|---|---|
| Plasma Gas: | Ar, 37 sccm, |
| Bias Power to Target: | 3500 W |
| Bias Power to Substrate: | 0 W |
| Power to Coil (Source Power): | 2 KW |
| Magnetic Field Strength Adjacent Substrate[1]: | 0 Gauss |
| Process Pressure: | 15 mTorr |

TABLE II

| Parameter | |
|---|---|
| Plasma Gas: | Ar, 37 sccm, |
| Bias Power to Target: | 3500 W |
| Bias Power to Substrate: | 0 W |
| Power to Coil (Source Power): | 2 KW |
| Magnetic Field Strength Adjacent Substrate[1]: | 200 Gauss |
| Process Pressure: | 15 mTorr |

[1]Magnetic Field Strength supplied by magnets disposed below the substrate as shown in FIG. 5.

The recipes of Tables I and II are substantially similar except that in the process of Table II a magnetic field was provided parallel to the upper surface of the substrate in a manner described above to cause deflection of electrons entering the device features. The particular apparatus used for the process of Table II was similar to the embodiment shown in FIG. 5. Thus, the magnetic field was provided by magnets disposed below the substrate and the substrate was rotated relative to the magnetic field at an angular velocity of 30 rpm. Because the embodiment of FIG. 5 was used, wherein permanent magnets supply the magnetic field, no bias was provided to the support member, plate or substrate in order to avoid demagnetizing the magnets. For each process of Table I and II, the via had a height of about 1.35 $\mu$m and a width of about 0.3–0.4 $\mu$m. The via was formed in a dielectric layer comprising $SiO_2$ and extended through the dielectric layer to a sublayer comprising Si. A titanium layer was then deposited onto the side walls and bottom of the via.

Subsequently, the deposition on the side wall and the bottom in each case was measured relative to the deposition on the upper surface of the substrate, known as the "field". Thus, two values were determined: percentage side wall coverage (SC) and percentage bottom coverage (BC), where SC is the thickness of deposition on the side wall divided by the thickness on the field, and BC is the thickness of deposition on the bottom divided by the thickness on the field. A higher value for SC and BC indicates superior deposition on the features and is therefore preferred. The SC after the process of Table I was about 4% at the upper end of the side wall proximate the opening of the via and about 3% at the lower end of the side wall proximate the bottom. The BC for the process of Table I was about 35%. In contrast, the SC after the process of Table II was about 7% at the upper end of the side wall proximate the opening of the via and about 6.1% at the lower end of the side wall proximate the bottom while the BC for the process of Table II was about 55%. Thus, the invention resulted in improved SC as well as BC. The improved BC is a result of the increased electron density adjacent the substrate. In operation, the electrons are trapped by the magnetic field and establish a negative region which is neutralized by the attraction of plasma ions. As a result, the overall ionization of the sputtered target material at the surface of the substrate is increased, thereby providing higher densities of target material ions for deposition.

Thus, the invention provides a method and apparatus for achieving improved step coverage in device features having high aspect ratios. It is understood that the process parameters shown in Table I and II are merely illustrative and the recipe may be adjusted according to a particular application.

While the foregoing is directed to the preferred embodiment of the present invention, other and further embodiments of the invention may be devised without departing from the basic scope thereof, and the scope thereof is determined by the claims that follow.

What is claimed is:

1. An apparatus, comprising:
    (a) a processing chamber defining a processing region;
    (b) a target disposed in the processing chamber;
    (c) a substrate support member disposed in the processing chamber;
    (d) an inductive coil disposed adjacent the processing region to provide a first magnetic field that ionizes target material; and
    (e) a magnetic field generator disposed proximate the processing chamber to provide a second magnetic field substantially parallel to an upper surface of the substrate support member.

2. The apparatus of claim 1, further comprising a magnetron assembly disposed adjacent the target.

3. The apparatus of claim 1, wherein the magnetic field generator comprises one or more magnets selected from the group consisting of permanent magnets, electromagnets and any combinations thereof.

4. The apparatus of claim 1, wherein the magnetic field generator is disposed in the substrate support member.

5. The apparatus of claim 1, wherein the magnetic field generator is disposed in a region external to the processing chamber.

6. The apparatus of claim 1, further comprising a gas source coupled to the processing chamber to supply a gas for generating a plasma in the processing region during processing.

7. The apparatus of claim 1, wherein the is an inductive coil further comprises a power source coupled to the coil.

8. The apparatus of claim 1, further comprising a power source coupled to the target.

9. An apparatus, comprising:
   (a) a processing chamber forming a cavity;
   (b) a target disposed in the cavity;
   (c) a substrate support member disposed in the cavity and having a support surface adapted to support a substrate;
   (d) an inductive coil disposed to provide a first magnetic field in the cavity that ionizes target material;
   (e) a second magnetic field generator disposed adjacent the processing chamber to provide a second magnetic field a portion of which is substantially parallel to the support surface;
   (f) one or more power sources coupled to the target, the substrate support member and the inductive coil; and
   (g) a gas source coupled to the processing chamber to supply a gas for generating a plasma in a processing region during processing.

10. The apparatus of claim 9, wherein the magnetic field generator comprises a magnetron assembly rotatable about an axis substantially perpendicular to the support surface.

11. The apparatus of claim 9, wherein the magnetic field generator comprises one or more magnets selected from the group consisting of permanent magnets, electromagnets and any combinations thereof.

12. The apparatus of claim 9, wherein the magnetic field generator comprises a rotatable magnetron assembly.

13. The apparatus of claim 9, wherein the magnetic field generator is disposed externally to the processing chamber.

14. A method for depositing a material onto a substrate, comprising:
   (a) sputtering a material from a target disposed in a vacuum chamber;
   (b) providing a first magnetic field for ionizing the material to generate charged particles by energizing a coil disposed proximate the vacuum chamber, wherein a first portion of the charged particles have a first polarity and a second portion of the charged particles have a second polarity; and
   (c) providing a second magnetic field in the vacuum chamber oriented substantially parallel to an upper surface of the substrate disposed in the vacuum chamber.

15. The method of claim 14, wherein (a) comprises:
   (i) introducing one or more gases to the vacuum chamber;
   (ii) biasing the target to a negative voltage.

16. The method of claim 14, wherein the second magnetic field is disposed to bias at least a portion of the charged particles having a velocity vector component oriented substantially perpendicularly to the second magnetic field.

17. The method of claim 14, wherein (c) comprises providing the second magnetic field at a strength between about 50 Gauss and about 800 Gauss.

18. The method of claim 14, further comprising:
   (d) rotating the second magnetic field.

19. The method of claim 14, further comprising:
   (d) rotating the second magnetic field and the substrate relative to one another.

20. The method of claim 14, wherein providing the second magnetic field comprises providing a magnetron having one or more magnetic dipoles disposed in a substrate support member having the substrate disposed thereon, and further comprising rotating the magnetron.

21. A method for depositing material onto a substrate, comprising:
   (a) sputtering material from a target disposed in a vacuum chamber;
   (b) providing a first magnetic field that ionizes target material by supplying power to a coil disposed proximate the vacuum chamber; and
   (c) modulating one or more secondary magnetic fields at least periodically oriented substantially parallel to an upper surface of a substrate disposed in the vacuum chamber.

22. The method of claim 21, wherein the one or more secondary magnetic fields are at a strength between about 50 Gauss and about 800 Gauss.

23. The method of claim 21, wherein the one or more secondary magnetic fields are disposed to produce a higher rate of deposition on a plane parallel to the one or more secondary magnetic fields.

24. The method of claim 21, wherein (c) comprises providing pulsed power to one or more electromagnets disposed proximate the vacuum chamber.

25. The method of claim 21, wherein (c) comprises altering a polarity of the one or more secondary magnetic fields relative to the substrate.

26. The method of claim 21, further comprising rotating the one or more secondary magnetic fields and the substrate relative to one another.

27. The method of claim 21, wherein (c) comprises alternately providing power to a first set of electromagnets disposed in spaced facing relation and a second set of electromagnets disposed in spaced facing relation; wherein the first set and second set of magnets are orthogonally disposed in relation to one another to form an enclosure having the substrate disposed therein.

28. The method of claim 21, wherein (c) comprises providing a pulsed signal to a first set of electromagnets disposed in parallel relation and a second set of electromagnets disposed in parallel relation; wherein the first set and second set of magnets are orthogonally disposed in relation to one another to form an enclosure having the substrate disposed therein.

* * * * *

UNITED STATES PATENT AND TRADEMARK OFFICE
CERTIFICATE OF CORRECTION

PATENT NO. : 6,143,140
DATED : November 7, 2000
INVENTOR(S) : Yao et al.

Page 1 of 1

It is certified that error appears in the above-identified patent and that said Letters Patent is hereby corrected as shown below:

One page one, references cited section, please insert "3-87365

04/12/1991   Sumitomo 204 298.16"

Column 11,
Line 5, please delete "is an".

Signed and Sealed this

Nineteenth Day of June, 2001

*Attest:*

Nicholas P. Godici

*Attesting Officer*

NICHOLAS P. GODICI
*Acting Director of the United States Patent and Trademark Office*